United States Patent
Murakami et al.

(10) Patent No.: US 9,349,642 B2
(45) Date of Patent: May 24, 2016

(54) METHOD OF FORMING CONTACT LAYER

(71) Applicant: TOKYO ELECTRON LIMITED, Tokyo (JP)

(72) Inventors: Seishi Murakami, Nirasaki (JP); Takaya Shimizu, Nirasaki (JP); Satoshi Wakabayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/570,352

(22) Filed: Dec. 15, 2014

(65) Prior Publication Data

US 2015/0179518 A1 Jun. 25, 2015

(30) Foreign Application Priority Data

Dec. 25, 2013 (JP) ................................. 2013-267707

(51) Int. Cl.
*H01L 21/768* (2006.01)
*H01L 21/3205* (2006.01)

(52) U.S. Cl.
CPC .... *H01L 21/76879* (2013.01); *H01L 21/32053* (2013.01)

(58) Field of Classification Search
None
See application file for complete search history.

(56) References Cited

U.S. PATENT DOCUMENTS 6,524,952 B1 * 2/2003 Srinivas ............ H01L 21/28518
257/E21.165
2010/0304561 A1 * 12/2010 Narushima ............. C23C 16/14
438/653

FOREIGN PATENT DOCUMENTS

JP 5-67585 A 3/1993

* cited by examiner

*Primary Examiner* — Asok Kumar Sarkar
(74) *Attorney, Agent, or Firm* — Nath, Goldberg & Meyer; Jerald L. Meyer

(57) ABSTRACT

A method of forming a contact layer on a substrate having a contact hole to make a contact between the substrate and a buried metal material, includes disposing the substrate in a chamber, introducing a Ti source gas, a reducing gas and an Si source gas into the chamber, and converting the Ti source gas, the reducing gas and the Si source gas into plasma to form a $TiSi_x$ film on the substrate. A portion of the $TiSi_x$ film in a bottom of the contact hole corresponds to the contact layer.

10 Claims, 6 Drawing Sheets

METHOD OF FORMING CONTACT LAYER

CROSS-REFERENCE TO RELATED APPLICATION

This application claims the benefit of Japanese Patent Application No. 2013-267707, filed on Dec. 25, 2013, in the Japan Patent Office, the disclosure of which is incorporated herein in its entirety by reference.

TECHNICAL FIELD

The present disclosure relates to a method of forming a contact layer on a substrate to make a contact between the substrate and a buried metal material.

BACKGROUND

In manufacturing semiconductor devices, in response to a recent request for high densification and high integration, circuitry tends to have a multi-layered wiring structure. For this reason, a burying technique for an electrical connection of a contact hole which connects an Si substrate as the lower layer and a wiring layer as the upper layer becomes important.

In order to make an ohmic contact between a metal wire (plug) used to bury such a contact hole and an Si substrate as the lower layer, a Ti film is formed on an inner side of the contact hole by a chemical vapor deposition (CVD) method prior to burying the contact hole. Thereafter, a contact area is formed by allowing the base Si substrate to react with the Ti film and selectively growing a $TiSi_x$ layer on the Si diffusion layer at the bottom of the contact hole, thereby obtaining good ohmic resistance. The described above is a well-known technique.

On the other hand, recently, an Si substrate containing carbon (C) is sometimes used in a logic device and the like. If the above-described technique is applied to the C-containing Si substrate, the Si base substrate becomes difficult to react with Ti, and C is introduced into the contact area, thereby increasing resistance. In addition, along with miniaturization of semiconductor devices, a diffusion layer on a substrate gradually narrows, and accordingly, the formation of the contact layer using the reaction with the substrate is limited.

SUMMARY

Some embodiments of the present disclosure provide a method capable of forming a contact layer without influence of a base substrate.

According to one embodiment of the present disclosure, there is provided a method of forming a contact layer on a substrate having a contact hole to make a contact between the substrate and a buried metal material, the method including disposing the substrate in a chamber, introducing a Ti source gas, a reducing gas and an Si source gas into the chamber, and converting the Ti source gas, the reducing gas and the Si source gas into plasma to form a $TiSi_x$ film on the substrate, a portion of the $TiSi_x$ film in a bottom of the contact hole corresponding to the contact layer.

According to another embodiment of the present disclosure, there is provided a method of forming a contact layer on a substrate having a contact hole to make a contact between the substrate and a buried metal material, the method including disposing the substrate in a chamber, introducing an Si source gas into the chamber to form an Si film on a portion of the substrate in a bottom of the contact hole, introducing a Ti source gas and a reducing gas into the chamber into the chamber, converting the Ti source gas and the reducing gas into plasma to form a Ti film on the substrate, and reacting the Ti film with the Si film, thereby forming a contact layer consisting of $TiSi_x$ in the bottom of the contact hole.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the following description, mL/min is used as a unit of a flow rate of a gas. Since a volume of a gas largely changes depending on temperature and pressure, a converted value into a standard state is used in the present disclosure. In addition, since a flow rate converted to the standard state is commonly represented in sccm (Standard Cubic Centimeter per Minutes), the unit "sccm" will be added. Here, the standard state refers to a state of a temperature of 0 degree C. (273.15K) and a pressure of 1 atm (101,325 Pa).

<Apparatus for Performing Method of Forming Contact Layer>

Figure 1:
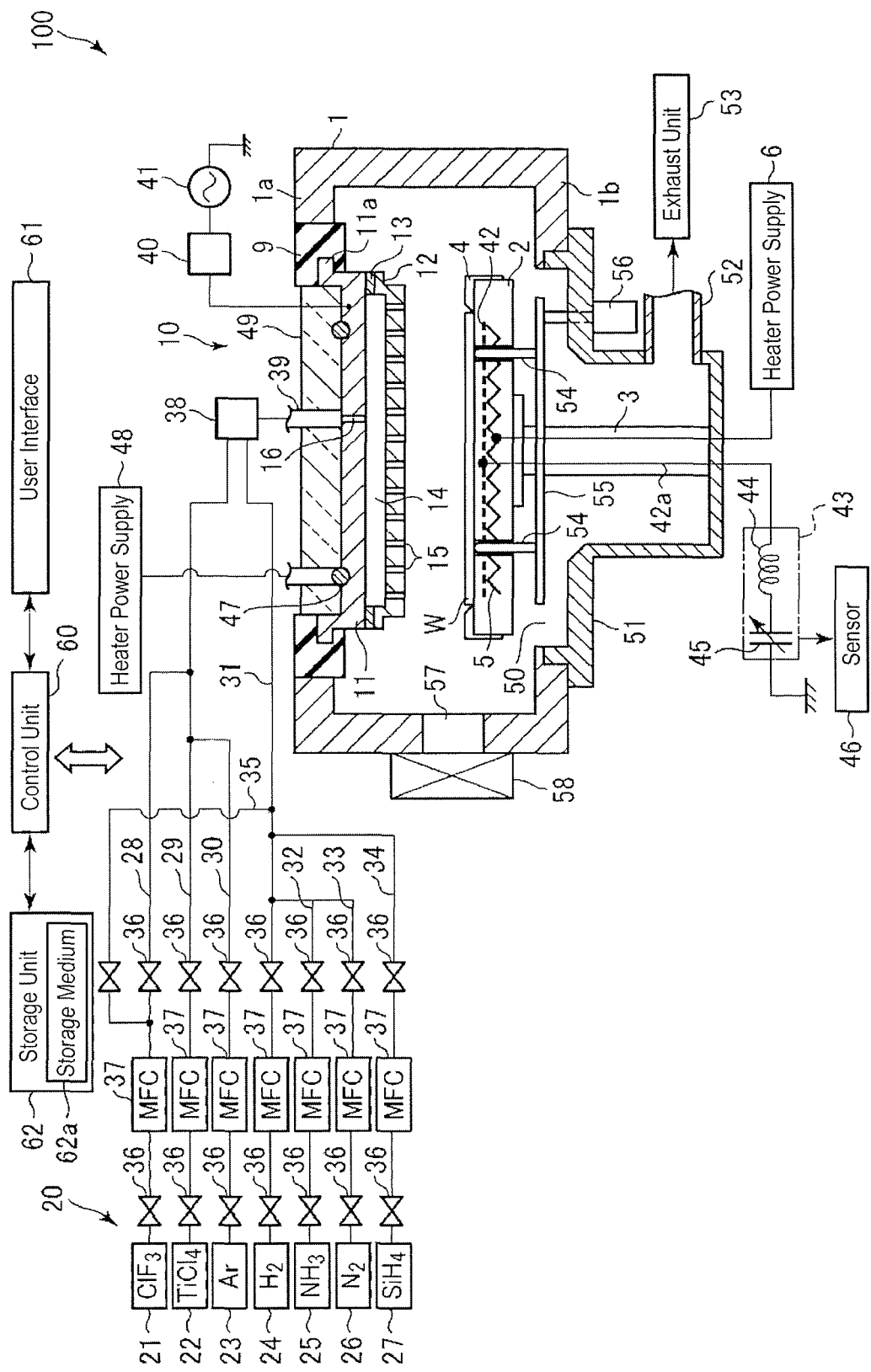
FIG. 1 is a schematic sectional view showing an example of a film forming apparatus for performing a method of forming a contact layer according to the present disclosure.

FIG. 1 is a schematic sectional view showing an example of a film forming apparatus for performing a method of forming a contact layer according to the present disclosure.

A film forming apparatus 100 is configured such that a $TiSi_x$ film, an Si film and a Ti film may be formed by a CVD method while plasma is generated by forming a high frequency electrical field in parallel flat plate electrodes.

The film forming apparatus 100 includes a mostly circular cylindrical chamber 1. In the chamber 1, a susceptor 2 as a mounting table (stage) made of MN to horizontally support an Si wafer (hereinafter, simply referred to as a wafer) W as a substrate to be processed is disposed to be supported by a circular cylinder-shaped support member 3 installed at the central lower portion of the susceptor 2. A guide ring 4 is installed on the outer edge portion of the susceptor 2 to guide the wafer W. In addition, a heater 5 made of a high melting point metal such as molybdenum is embedded in the susceptor 2, and the heater 5 is supplied with power from a heater power supply 6 to heat the wafer W as the substrate to be processed to a predetermined temperature.

A pre-mix type shower head 10, which also functions as an upper electrode of parallel flat plate electrodes, is installed in a ceiling wall 1a of the chamber 1 via an insulating member 9. The shower head 10 has a base member 11 and a shower plate 12, and an outer peripheral portion of the shower plate 12 is fixed by screws (not shown) to the base member 11 via an annular intermediate member 13 to prevent from attaching to each other. The shower plate 12 is in the shape of a flange and has a recess formed therein, and a gas diffusion space 14 is defined between the base member 11 and the shower plate 12. The base member 11 has a flange portion 11a formed in an outer periphery of the base member 11, and the flange portion 11a is supported by the insulating member 9. The shower plate 12 has a plurality of gas discharge holes 15 formed therein, and the base member 11 has a gas introduction hole 16 formed in the vicinity of the center of the base member 11.

In addition, the gas introduction hole 16 is connected to a gas line of a gas supply mechanism 20.

The gas supply mechanism 20 includes a $ClF_3$ gas supply source 21 for supplying a $ClF_3$ gas as a cleaning gas, a $TiCl_4$ gas supply source 22 for supplying a $TiCl_4$ gas as a Ti compound gas, an Ar gas supply source 23 for supplying an Ar gas used as a plasma generation gas or a purge gas, an $H_2$ gas supply source 24 for supplying an $H_2$ gas as a reducing gas, an $NH_3$ gas supply source 25 for supplying an $NH_3$ gas as a nitriding gas, an $N_2$ gas supply source 26 for supplying an $N_2$ gas, and an $SiH_4$ gas supply source 27 for supplying an $SiH_4$ gas as an Si compound gas. In addition, the $ClF_3$ gas supply source 21 is connected to $ClF_3$ gas supply lines 28 and 35, the $TiCl_4$ gas supply source 22 is connected to a $TiCl_4$ gas supply line 29, the Ar gas supply source 23 is connected to an Ar gas supply line 30, the $H_2$ gas supply source 24 is connected to an $H_2$ gas supply line 31, the $NH_3$ gas supply source 25 is connected to an $NH_3$ gas supply line 32, the $N_2$ gas supply source 26 is connected to an $N_2$ gas supply line 33, and the $SiH_4$ gas supply source 27 is connected to an $SiH_4$ gas supply line 34. In addition, each of the gas lines is provided with a mass flow controller 37 and two valves 36 with the mass flow controller 37 interposed therebetween.

The $ClF_3$ gas supply line 28 and the Ar gas supply line 30 are connected to the $TiCl_4$ gas supply line 29. In addition, the $NH_3$ gas supply line 32, the $N_2$ gas supply line 33, the $SiH_4$ gas supply line 34, and the $ClF_3$ gas supply line 35 are connected to the $H_2$ gas supply line 31. The $TiCl_4$ gas supply line 29 and the $H_2$ gas supply line 31 are connected to a gas mixing unit 38, so that the mixed gas is introduced into the gas introduction hole 16 through a gas pipe 39. Further, the mixed gas reaches the gas diffusion space 14 through the gas introduction hole 16 and is discharged to the wafer W in the chamber 1 through the gas discharge holes 15 of the shower plate 12.

The shower head 10 is connected to a high frequency power supply 41 via a matching unit 40, and the shower head 10 is supplied with high frequency power from the high frequency power supply 41. The shower head 10 functions as the upper electrode of the parallel flat plate electrodes. On the other hand, an electrode 42 which functions as a lower electrode of the parallel flat plate electrodes is embedded in the vicinity of the surface of the susceptor 2. Therefore, as the shower head 10 is supplied with high frequency power, a high frequency electrical field is formed between the shower head 10 and the electrode 42, and the high frequency electrical field causes the processing gas to be converted into plasma. The frequency of the high frequency power supply 41 is preferably set to 200 kHz to 13.56 MHz, typically 450 kHz in some embodiment.

A transmission line 42a connected to the electrode 42 is connected to an impedance adjustment circuit 43. The impedance adjustment circuit 43 is to increase a current by decreasing the impedance of the transmission line 42a viewed from a place P where plasma is generated and, for example, includes a coil 44 and a variable capacitor 45. The current flowing in the transmission line 42a is detected by a sensor 46, and reactance of the impedance adjustment circuit 43 is controlled based on the detected value.

In addition, the base member 11 of the shower head 10 is provided with a heater 47 for heating the shower head 10. The heater 47 is connected to a heater power supply 48, and the shower head 10 is heated to a desired temperature by supplying power to the heater 47 from the heater power supply 48. A recess formed in the upper portion of the base member 11 is provided with a thermally insulating member 49.

The chamber 1 has a circular hole 50 formed in the central portion of a bottom wall 1b of the chamber 1, and the bottom wall 1b is provided with an exhaust chamber 51 protruding downward to cover the hole 50. An exhaust pipe 52 is connected to a lateral surface of the exhaust chamber 51, and an exhaust unit 53 is connected to the exhaust pipe 52. In addition, the exhaust unit 53 operates to enable the interior of the chamber 1 to be depressurized to a predetermined degree of vacuum.

Three wafer support pins 54 (only two of which are shown) for supporting and lifting the wafer W are installed in the susceptor 2 such that the wafer support pins 54 protrude from and retract into the surface of the susceptor 2, and the wafer support pins 54 are supported by a support plate 55. Further, the wafer support pins 54 are lifted up and down by a driving mechanism 56 such as an air cylinder via the support plate 55.

A lateral side of the chamber 1 is provided with a gate 57 for loading and unloading the wafer W between the chamber 1 and a wafer transfer chamber (not shown) adjacent thereto, and a gate valve 58 for opening and closing the gate 57.

The heater power supplies 6 and 48, the valves 36, the mass flow controllers 37, the matching unit 40, the high frequency power supply 41, the variable capacitor 45, the driving mechanism 56, and the like, which constitute the film forming apparatus 100, are configured to be connected to and controlled by a control unit 60 provided with a microprocessor (computer). In addition, the control unit 60 is connected to a user interface 61 having a keyboard through which an operator performs a command input to manage the film forming apparatus 100, a display configured to visually display the operational states of the film forming apparatus 100 and the like. In addition, the control unit 60 is connected to a storage unit 62 configured to store programs for realizing a variety of processes performed by the film forming apparatus 100 under the control of the control unit 60 or programs, i.e., processing recipes, for executing processes in the respective components of the film forming apparatus 100 according to various processing conditions. The processing recipes are stored in a storage medium 62a in the storage unit 62. The storage medium may be a stationary medium such as a hard disk or a portable medium such as a CD-ROM or a DVD. Alternatively, the recipes may be suitably transmitted from other devices via, e.g., a dedicated transmission line. Further, if necessary, a predetermined processing recipe is read out from the storage unit 62 under instructions from the user interface 61 and is executed by the control unit 60, whereby a desired process is performed in the film forming apparatus 100 under the control of the control unit 60.

<First Embodiment of Method of Forming Contact Layer>

Subsequently, a first embodiment of a method of forming a contact layer which is performed using the film forming apparatus 100 will be described.

Figure 2A:
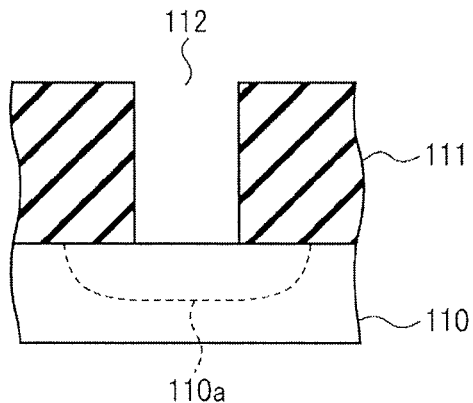
FIGS. 2A to 2C are process sectional views showing a first embodiment of the method of forming a contact layer.
Figure 2B:
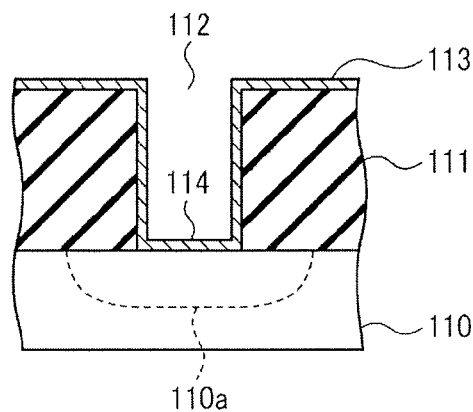
Figure 2C:
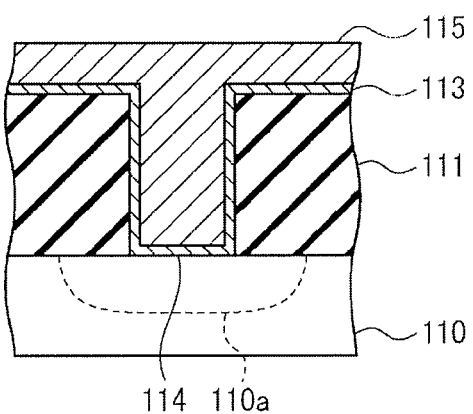

FIGS. 2A to 2C are process sectional views showing the first embodiment of the method of forming a contact layer. In this embodiment, the wafer W has a structure in which an interlayer insulating film 111 is formed on an Si substrate 110 and a contact hole 112 is formed in the interlayer insulating film 111 to reach an impurity diffusion region 110a of the Si substrate 110, for example (FIG. 2A). Then, the film forming apparatus 100 of FIG. 1 is used to form a $TiSi_x$ film 113 on the entire surface of the wafer W, as will be described in the following (FIG. 2B).

When the $TiSi_x$ film is first formed in the film forming apparatus 100, after an internal pressure of the chamber 1 is adjusted, the gate valve 58 is opened, and the wafer W having the structure of FIG. 2A is loaded into the chamber 1 from the transfer chamber (not shown) through the gate 57. Then, while maintaining the interior of the chamber 1 at a predetermined degree of vacuum, a pre-flow process is performed by flowing the Ar gas, the $H_2$ gas, the $TiCl_4$ gas, and the $SiH_4$ gas into a pre-flow line (not shown) at a time when the temperature of the wafer W is almost stable by preheating the wafer W. Thereafter, while maintaining a gas flow rate and pressure constant, the line is switched to a line for film formation, thereby introducing these gases into the chamber 1 through the shower head 10.

Then, after the introduction of these gases is initiated, plasma of the Ar gas, the $H_2$ gas, the $TiCl_4$ gas and the $SiH_4$ gas introduced into the chamber 1 is generated by applying high frequency power to the shower head 10 from the high frequency power supply 41, and the gases which have been converted into plasma are allowed to react on the wafer W heated to a predetermined temperature by the heater 5, thereby depositing the $TiSi_x$ film 113 on the surface of the substrate 110. Using the plasma as described above, it is possible to easily form the $TiSi_x$ film on the inside of the contact hole 112.

A portion of the $TiSi_x$ film 113 in contact with the substrate 110 in the bottom of the contact hole 112 becomes a contact layer 114. In this state, the contact hole 112 is filled with a metal 115, whereby an ohmic contact is formed between the metal 115 and the impurity diffusion region 110a of the substrate 110 via the contact layer 114 (FIG. 2C).

In a related art, a contact area has been formed by selectively growing $TiSi_x$ by the reaction between a Ti film and Si constituting a base substrate. However, the reaction between Si of the base substrate and Ti is difficult to occur in a C-containing Si substrate used in logic devices and the like. In addition, there is a problem in that C is introduced into the contact area to increase resistance, or a narrow diffusion layer involved in the miniaturization of semiconductor devices is hard to handle.

Therefore, in this embodiment, the $TiSi_x$ film 113 is directly formed on the impurity diffusion region of the substrate 110 by the CVD method. Accordingly, a good contact layer can be obtained regardless of a condition of the base substrate.

In this case, when the $TiSi_x$ film is formed, the gases for forming the film need to be converted into plasma in order that a good contact layer having fewer impurities is formed.

Figure 3:
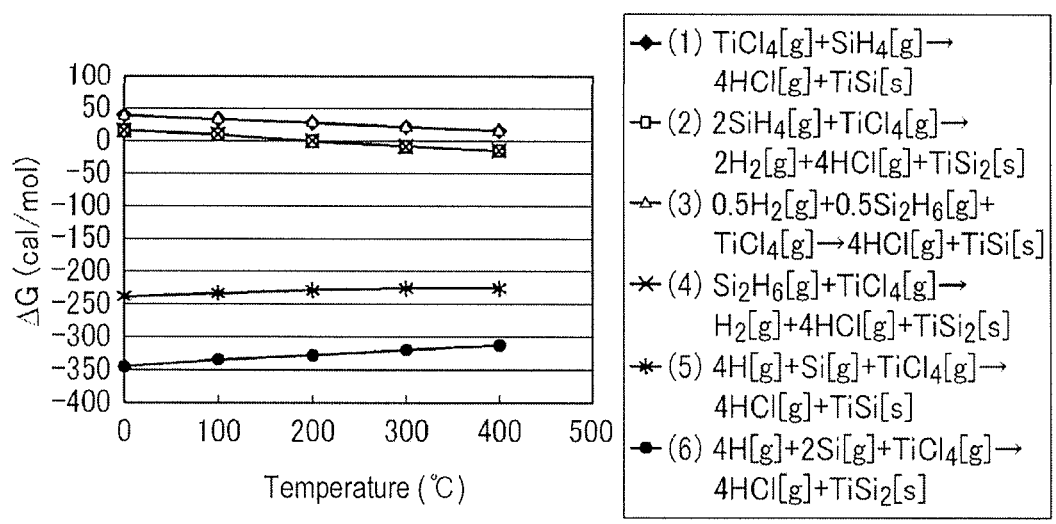
FIG. 3 is a view showing a relationship between Gibbs' free energy and a temperature at a reaction when a $TiSi_x$ film is formed.

That is, when the $TiSi_x$ film is formed using the $TiCl_4$ gas as a Ti source and the $SiH_4$ gas as an Si source, as shown in FIG. 3, Gibbs' free energy in the gas reactions represented in (1) to (4) is near zero (0) and the reaction for producing $TiSi_x$ is difficult to occur, whereas when the gases are converted into plasma as shown in (5) and (6), Gibbs' free energy has a negative value having a large absolute value and the reaction progresses sufficiently. Therefore, using the plasma promotes the formation of $TiSi_x$ and the desorption of Cl as impurity, thereby being capable of producing the $TiSi_x$ film of good quality having a low specific resistance.

In addition, it is preferred in some embodiments that a film forming temperature is equal to or less than 500 degrees C. This is because if the film forming temperature exceeds 500 degrees C., there are a possibility for the impurities to be diffused into the contact layer and a possibility of a bad influence on the device. Equal to or less than 450 degrees C. as the film forming temperature is more preferable in some embodiments. However, since the good film quality cannot be obtained if the temperature is too low, equal to or higher than 350 degrees C. is preferable in some embodiments.

In some embodiments, in order to obtain the $TiSi_x$ film of good quality, preferably, the Ar gas as the plasma generation gas is ionized by using maximally large power and the $TiCl_4$ gas is dissociated by the Ar ions, thereby enabling Cl to be efficiently removed and the $TiSi_x$ film to be formed in the bottom of the contact hole with good reactivity. However, since a portion of the current flows in the wafer W from the plasma and more than half of the current flows in the wall portion of the chamber, if the high frequency power of a sufficiently large output is supplied, the current flowing in the wall portion of the chamber from the plasma becomes large and thus the plasma is destabilized, whereby it is apprehended that abnormal electric discharge or the like may occur.

Therefore, in the film forming apparatus of FIG. 1, such a problem may be solved by installing the impedance adjustment circuit 43 on the transmission line 42a connected to the electrode 42 in the susceptor 2 to enable impedance of the transmission line 42a viewed from the place P is generated to be adjusted.

That is, the supply of the sufficient large power is for promoting the gas dissociation by enlarging a potential difference (V) of plasma sheath between the plasma and the wafer so as to accelerate the ions. According to Ohm's law (V=ZI), if the current (I) flowing to the wafer from the plasma is increased, the potential difference can be enlarged even if the high frequency power is low (wherein, Z is impedance).

Figure 4:
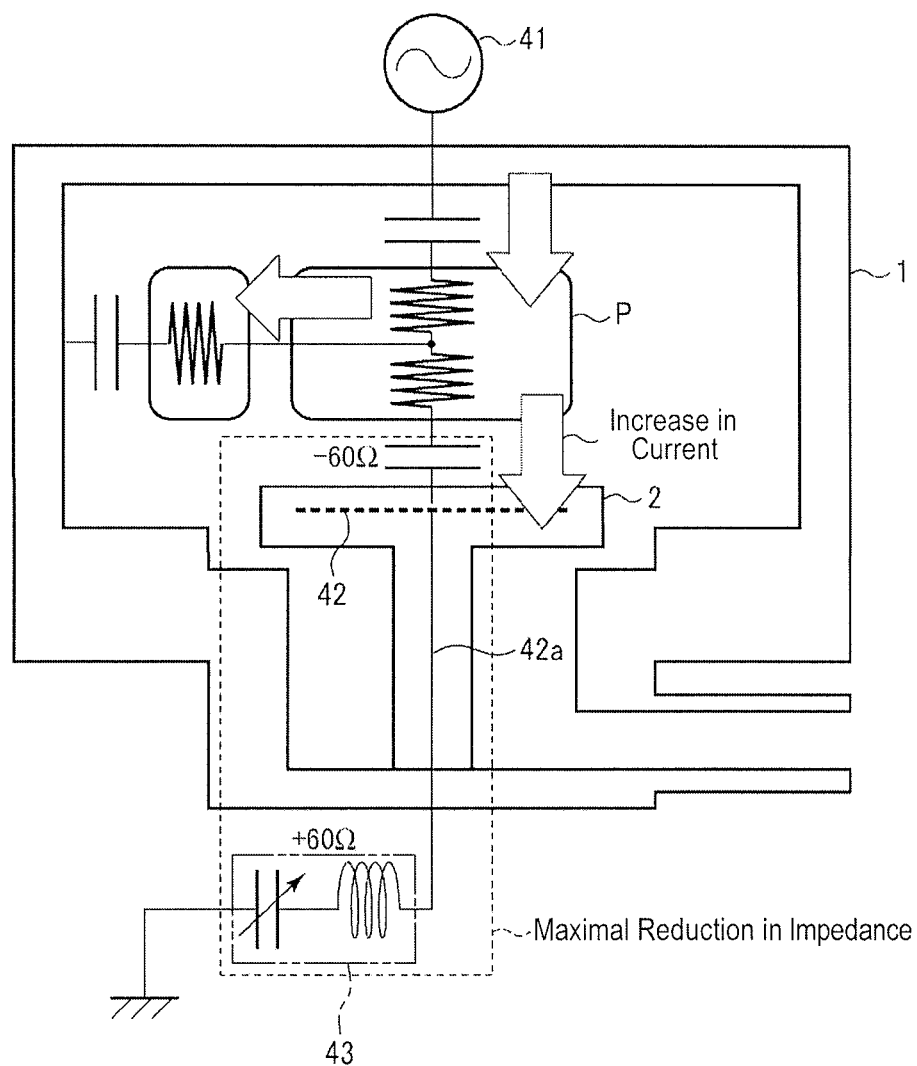
FIG. 4 is a schematic view of the film forming apparatus for illustrating a function of an impedance adjustment circuit.

There are capacitive components such as the plasma sheath and the susceptor 2 between the plasma and the wafer, and they function as resistors. As shown in FIG. 4, the impedance adjustment circuit 43 can cancel the capacitive components and maximally reduce the impedance in the transmission line 42a, thereby effectively increasing the current flowing in the transmission line 42a from the plasma through the wafer W. For this reason, the gas dissociation can be promoted even by relatively small power, thereby increasing the reactivity. Further, although, in FIG. 1, the impedance adjustment circuit 43 uses a combination of the coil 44 and the variable capacitor 45 in order that the impedance is adjusted by the variable capacitor 45, the present disclosure is not limited thereto.

In addition, by increasing the current flowing in the wafer W from the plasma, it is possible to make the current flowing in the wall portion of the chamber from the plasma relatively small. Thus, the plasma can be stabilized even when the high frequency power is increased.

In this embodiment, the high frequency power equal to or higher than 100 W is preferable in order that the $TiCl_4$ gas is sufficiently dissociated to obtain good reactivity, and the high frequency power equal to or less than 3000 W is preferable in order that plasma stability is not decreased and plasma damage does not occur.

In the $TiSi_x$ film of this embodiment, the frequency of the high frequency power supplied from the high frequency power supply 41 is preferably in a range of 200 kHz to 13.56 MHz, typically 450 kHz. This is because such a frequency is advantageous for converting the Ar gas introduced as the plasma gas into Ar ions having high energy.

The lower the internal pressure of the chamber 1 is, the further the plasma damage decreases. If the pressure is too low, in-plane uniformity (resistance value) of the $TiSi_x$ film remarkably deteriorates. In addition, if the pressure is too high, the resistance value of the $TiSi_x$ film is undesirably increased. Therefore, in light of this, preferable ranges are defined.

Specific ranges of conditions for forming the $TiSi_x$ film are as follows:

Output of High Frequency Power: 100 to 3000 W

Flow rate of $TiCl_4$ Gas (Flow Rate for Film Formation): 1 to 100 mL/min (sccm), more preferably 3.5 to 20 mL/min (sccm)

Flow rate of Ar Gas: 100 to 10000 mL/min (sccm)

Flow rate of $H_2$ Gas: 50 to 5000 mL/min (sccm)

Flow rate of $SiH_4$ Gas: 1 to 2000 mL/min (sccm)

Internal Pressure of Chamber: 13.3 to 1333 Pa (0.1 to 10 Torr)

Wafer Temperature in Film Formation: 350 to 500 degrees C.

In addition, a time of forming a film is appropriately set according to a film thickness desirous to be obtained. It is preferable that the contact layer 114 consisting of the $TiSi_x$ film have a thickness of 1 to 10 nm or so.

After the $TiSi_x$ film is formed in the above manner, the $TiSi_x$ film may be subjected to nitriding as necessary. In the nitriding, after the formation of the $TiSi_x$ film is terminated, the supply of the $TiCl_4$ gas and the $SiH_4$ gas is stopped, while the $H_2$ gas and the Ar gas continue to flow. While the interior of the chamber 1 is heated at an appropriate temperature, the $NH_3$ gas as a nitriding gas is allowed to flow and the processing gases are converted into plasma by applying high frequency power to the shower head 10 from the high frequency power supply 41. Then, the surface of the $TiSi_x$ film is nitrided by the plasma of the processing gases.

After the $TiSi_x$ film is formed or subjected to the nitriding, the gate valve 58 is opened, and the wafer W is unloaded to the wafer transfer chamber (not shown) through the gate 57.

In this way, the formation of the $TiSi_x$ film and, as necessary, the nitriding the surface of the $TiSi_x$ film is performed on a predetermined number of wafers and then the chamber 1 is cleaned. The cleaning process is performed, in a state where no wafer is present in the chamber 1, by introducing the $ClF_3$ gas into the chamber 1 from the $ClF_3$ gas supply source 21 through the $ClF_3$ gas supply lines 28 and 35 and by heating the shower head 10 at an appropriate temperature to perform dry cleaning.

In addition, although the $TiCl_4$ gas is used as the Ti source gas, the $H_2$ gas is used as the reducing gas, the $SiH_4$ gas is used as the Si source gas, and the Ar gas is used as the plasma generation gas in this embodiment, the present disclosure is not limited thereto.

Further, although the Ti source gas, the reducing gas, and the Si source gas are simultaneously supplied to form the $TiSi_x$ film by plasma CVD in this embodiment, the $TiSi_x$ film may be formed by an atomic layer deposition (ALD) method with plasma, in which a purge by the purge gas such as Ar gas or $N_2$ gas is repeated between the supply of the Ti source gas and reducing gas and the supply of the Si source gas or among the supply of the Ti source, the supply of the reducing gas and the supply of the Si source gas.

<Second Embodiment of Method of Forming Contact Layer>

Subsequently, a second embodiment of the method of forming a contact layer which is performed using the film forming apparatus 100 will be described.

Figure 5A:
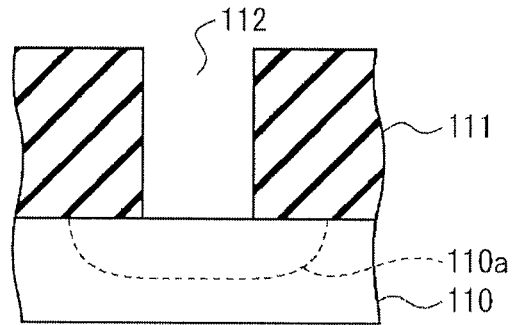
FIGS. 5A to 5D are process sectional views showing a second embodiment of the method of forming a contact layer.
Figure 5B:
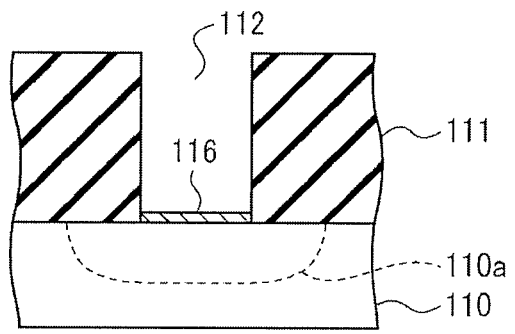

FIGS. 5A to 5D are sectional views showing the second embodiment of the method of forming a contact layer. In this embodiment, as shown in FIGS. 5A to 5D, in the same manner as the first embodiment, the wafer W has a structure in which, for example, an interlayer insulating film 111 is formed on an Si substrate 110 and a contact hole 112 is formed in the interlayer insulating film 111 to reach an impurity diffusion region 110a of the Si substrate 110 (FIG. 5A). Then, the film forming apparatus 100 is used to selectively form an Si film 116 in the region of the Si substrate 110 in the bottom of the contact hole 112 (FIG. 5B).

When the Si film 116 is formed, the wafer W having the structure of FIG. 5A is loaded into the chamber 1 from the transfer chamber (not shown) through the gate 57. After the wafer W is preheated and a pre-flow process of the $SiH_4$ gas and the Ar gas is performed, while maintaining a gas flow rate and pressure constant, the line is switched to a line for film formation, thereby introducing the $SiH_4$ gas into the chamber 1 through the shower head 10 to selectively form the Si film 116 on the region of the Si substrate 110 in the bottom of the contact hole 112. Here, when the Ar gas is introduced, high frequency power may be applied to the shower head 10 from the high frequency power supply 41 to generate plasma.

At this time, specific conditions for forming the film are as follows:

Flow rate of $SiH_4$ Gas: 1 to 2000 mL/min (sccm)

Internal Pressure of Chamber: 13.3 to 1333 Pa (0.1 to 10 Torr)

Wafer Temperature in Forming Film: 350 to 500 degrees C.

Thickness of Si Film: 1 to 10 nm

Figure 5C:
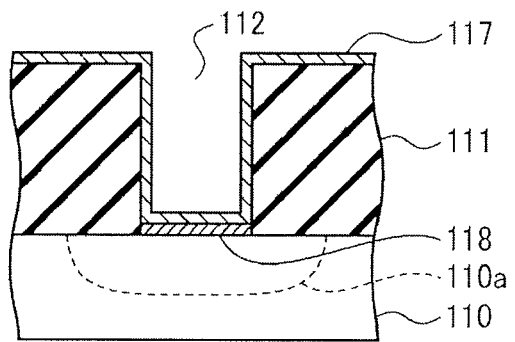
Figure 5D:
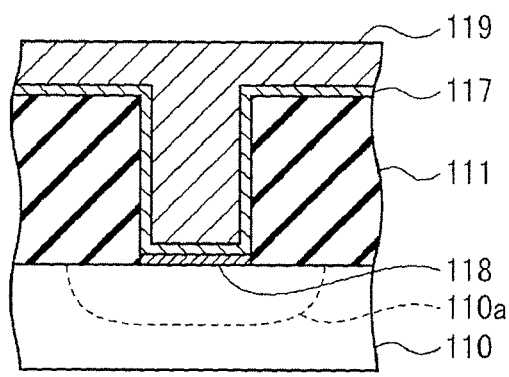

After the Si film 116 is formed, a Ti film 117 is formed on the entire surface, and a contact layer 118 consisting of $TiSi_x$ is formed by the reaction of the Si film 116 with the Ti film 117 in the bottom of the contact hole 112 (FIG. 5C). In this state, the contact hole 112 is filled with a metal 119, whereby an ohmic contact is formed between the metal 119 and the impurity diffusion region of the substrate 110 via the contact layer 118 (FIG. 5D).

The Ti film is formed in the apparatus of FIG. 1 after the Si film is formed and then the interior of the chamber 1 is purged. After the purge, a pre-flow process is performed by flowing the Ar gas, the $H_2$ gas, and the $TiCl_4$ gas into a pre-flow line (not shown). Thereafter, while maintaining a gas flow rate and pressure constant, the line is switched to a line for film formation, thereby introducing these gases into the chamber 1 through the shower head 10. After the introduction of these gases is initiated, plasma of the Ar gas, the $H_2$ gas, and the $TiCl_4$ gas introduced into the chamber 1 is generated by applying high frequency power to the shower head 10 from the high frequency power supply 41, and the $TiCl_4$ gas and the $H_2$ gas having been converted into plasma react on the wafer W heated to a predetermined temperature by the heater 5, thereby forming the Ti film 117 on the surface of the substrate 110. Then, the heat and plasma when the Ti film 117 is formed causes the Si film 116 formed in the bottom of the contact hole 112 to react with the Ti film 117, thereby forming the contact layer 118 consisting of $TiSi_x$. At this time, as shown in FIG. 5C, only a portion of the Ti film 117 may be allowed to react with the Si film 116, or the entirety of the Ti film 117 may be allowed to react with the Si film 116. In order to promote the reaction at this time, an annealing process may be performed after the Ti film is formed.

In this embodiment, since the Si film 116 is formed on the impurity diffusion region of the substrate 110 by the CVD method, the Ti film 117 is formed thereon, and the contact layer 118 consisting of TiSi$_x$ is formed by the reaction, a good contact layer can be obtained regardless of a condition of the base substrate, in the same manner as the first embodiment.

Since the TiSi$_x$ layer is obtained by forming the Si film and then forming the Ti film by the plasma CVD method as described above, the decomposition of TiCl$_4$ which is the Ti source and the desorption of Cl are promoted. Thus, the Ti film of good quality is formed, and the contact layer consisting of TiSi$_x$ formed by the reaction of the Ti film with the Si film has few impurities and thus has low resistance.

In the same manner as the formation of the TiSi$_x$ film according to the first embodiment, it is preferred in some embodiments that a film forming temperature of the Ti film is equal to or less than 500 degrees C. This is because if the film forming temperature exceeds 500 degrees C., it is possible that the impurities may be diffused onto the contact layer or a bad influence on the device may be caused. The temperature equal to or less than 450 degrees C. is more preferable in some embodiments. However, since the good film quality cannot be obtained if the temperature is too low, the temperature equal to or higher than 350 degrees C. is preferable in some embodiments.

Further, in the same manner as the first embodiment, as the impedance of the transmission line 42a viewed from the place P where the plasma is generated may also be adjusted by the impedance adjustment circuit 43 installed on the transmission line 42a connected to the electrode 42 in the susceptor 2 in the Ti film formation according to this embodiment. This allows the gas dissociation to be promoted by effectively increasing the current flowing in the transmission line 42a from the plasma through the wafer W without applying large power, thereby obtaining a good reactivity.

In addition, by increasing the current flowing in the wafer W from the plasma, it is possible to make the current flowing in the wall portion of the chamber from the plasma relatively small. Thus, the plasma can be stabilized even when the high frequency power is increased.

In the same manner as the first embodiment, when the Ti film is formed according to this embodiment, the frequency of the high frequency power supplied from the high frequency power supply 41 is also preferably in a range of 200 kHz to 13.56 MHz, typically 450 kHz in some embodiments. In addition, a high frequency power of 100 to 3000 W is preferably used in the same manner as the first embodiment.

In the Ti film formation according to this embodiment, the lower the internal pressure of the chamber 1 is, the further the plasma damage decreases. If the pressure is too low, in-plane uniformity (resistance value) of the Ti film remarkably deteriorates. In addition, if the pressure is too high, the resistance value of the Ti film is undesirably increased. Therefore, in light of this, preferable ranges are defined.

Specific ranges of conditions for forming the Ti film are as follows:

Output of High Frequency Power: 100 to 3000 W

Flow rate of TiCl$_4$ Gas (Flow Rate for Film Formation): 1 to 100 mL/min (sccm), more preferably 3.5 to 20 mL/min (sccm)

Flow rate of Ar Gas: 100 to 10000 mL/min (sccm)

Flow rate of H$_2$ Gas: 50 to 5000 mL/min (sccm)

Internal Pressure of Chamber: 13.3 to 1333 Pa (0.1 to 10 Torr)

Wafer Temperature in Film Formation: 350 to 500 degrees C.

In addition, a time of forming a film is appropriately set according to a film thickness desirous to be obtained. It is preferable that the TiSi$_x$ film 118 have a thickness of 1 to 10 nm or so in some embodiments.

After the Ti film is formed in the above manner, the Ti film may be subjected to nitriding as necessary. In the nitriding, after the formation of the Ti film is terminated, the supply of the TiCl$_4$ gas is stopped, while the H$_2$ gas and the Ar gas continue to flow. While the interior of the chamber 1 is heated at an appropriate temperature, the NH$_3$ gas as a nitriding gas is allowed to flow and the processing gases are converted into plasma by applying high frequency power to the shower head 10 from the high frequency power supply 41. Then, the surface of Ti film is nitrided by the plasma of the processing gases.

After the Ti film is formed or subjected to the nitriding, the gate valve 58 is opened, and the wafer W is unloaded to the wafer transfer chamber (not shown) through the gate 57. Further, in the same manner as the first embodiment, the interior of the chamber 1 is cleaned by the ClF$_3$ gas at a predetermined timing.

In addition, although the SiH$_4$ gas is used as the Si source gas when the Si film is formed, the TiCl$_4$ gas is used as the Ti source gas when the Ti film is formed, the H$_2$ gas is used as the reducing gas, and the Ar gas is used as the plasma generation gas in this embodiment, the present disclosure is not limited thereto.

Further, although the Ti source gas and the reducing gas were simultaneously supplied to form the Ti film by plasma CVD in this embodiment, the Ti film may be formed by an atomic layer deposition (ALD) method with plasma, wherein a purge by the purge gas such as Ar gas or N$_2$ gas is repeated between the supply of the Ti source gas and the supply of the reducing gas.

<Other Applications>

In addition, the present disclosure is not limited to the above-described embodiments but may be variously modified. For example, while it has been described in the above embodiments that a high frequency electrical field is formed to generate plasma by applying high frequency power to the shower head, the high frequency power may be applied to the susceptor. In addition, the plasma generating mechanism is not limited to the parallel flat plate type plasma generating mechanism.

Further, while it has been described in the above embodiment that the Ti film is formed on the silicon substrate, the substrate useful for the present disclosure is not limited to the silicon substrate.

According to the present disclosure, since no reaction with a substrate occurs, a contact layer can be formed without being influenced by a base substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a contact layer on a substrate having a contact hole to make a contact between the substrate and a buried metal material, the method comprising:

disposing the substrate in a chamber;

introducing a Ti source gas, a reducing gas and a Si source gas into the chamber simultaneously; and converting the Ti source gas, the reducing gas and the Si source gas into plasma to form a $TiSi_x$ film on the substrate, a portion of the $TiSi_x$ film in a bottom of the contact hole corresponding to the contact layer.

2. The method of claim 1, wherein the Ti source gas includes a $TiCl_4$ gas, and the reducing gas includes a $H_2$ gas.

3. The method of claim 2, wherein a temperature when the $TiSi_x$ film is formed is equal to or less than 500 degrees C.

4. The method of claim 1, wherein an Ar gas as a plasma generation gas is introduced into the chamber when the $TiSi_x$ film is formed.

5. The method of claim 1, wherein the substrate is mounted on a mounting table installed in the chamber, a lower electrode is installed in the mounting table, an upper electrode is installed to face the mounting table, and the upper electrode is supplied with high frequency power, thereby generating the plasma by a high frequency electrical field formed between the upper electrode and the lower electrode.

6. The method of claim 5, wherein an impedance adjustment circuit is connected to a transmission line connected to the lower electrode, and gas dissociation is promoted by decreasing impedance of the transmission line viewed from a place where the plasma is generated to increase current flowing in the lower electrode from the plasma.

7. A method of forming a contact layer on a substrate having a contact hole to make a contact between the substrate and a buried metal material, the method comprising:
disposing the substrate in a chamber;
introducing a Si source gas into the chamber to form a Si film on a portion of the substrate in a bottom of the contact hole;
introducing a Ti source gas and a reducing gas into the chamber after introducing the Si source gas;
converting the Ti source gas and the reducing gas into plasma to form a Ti film on the substrate; and
reacting the Ti film with the Si film, thereby forming a contact layer consisting of $TiSi_x$ in the bottom of the contact hole.

8. The method of claim 7, wherein the Ti source gas includes $TiCl_4$ gas, and the reducing gas includes $H_2$ gas.

9. The method of claim 8, wherein a temperature when the Ti film is formed is equal to or less than 500 degrees C.

10. The method of claim 7, wherein an Ar gas as a plasma generation gas is introduced into the chamber when the Ti film is formed.

* * * * *